(12) United States Patent
Lung

(10) Patent No.: US 8,497,182 B2
(45) Date of Patent: Jul. 30, 2013

(54) SIDEWALL THIN FILM ELECTRODE WITH SELF-ALIGNED TOP ELECTRODE AND PROGRAMMABLE RESISTANCE MEMORY

(75) Inventor: Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 218 days.

(21) Appl. No.: 13/089,934

(22) Filed: Apr. 19, 2011

(65) Prior Publication Data

US 2012/0267597 A1 Oct. 25, 2012

(51) Int. Cl.
*H01L 21/20* (2006.01)

(52) U.S. Cl.
USPC ............... 438/397; 438/385; 438/387; 257/4; 257/E21.645

(58) Field of Classification Search
CPC .................................................... H01L 27/1052
USPC .............. 438/397, 385, 387; 257/4, E21.645
See application file for complete search history.

(56) References Cited

U.S. PATENT DOCUMENTS

| | | | |
|---|---|---|---|
| 5,389,566 A | 2/1995 | Lage | |
| 5,687,112 A | 11/1997 | Ovshinsky | |
| 5,751,012 A | 5/1998 | Wolstenholme et al. | |
| 6,507,061 B1 | 1/2003 | Hudgens et al. | |
| 6,555,858 B1 | 4/2003 | Jones et al. | |
| 6,579,760 B1 | 6/2003 | Lung | |
| 6,617,192 B1 | 9/2003 | Lowrey et al. | |
| 6,800,504 B2 | 10/2004 | Li et al. | |
| 6,897,467 B2 | 5/2005 | Doan et al. | |
| 7,018,911 B2 | 3/2006 | Lee et al. | |
| 7,394,089 B2 | 7/2008 | Doyle et al. | |
| 7,465,675 B2 | 12/2008 | Koh | |
| 7,485,891 B2 | 2/2009 | Hamann et al. | |
| 7,504,653 B2 | 3/2009 | Lung | |
| 7,560,337 B2 | 7/2009 | Ho et al. | |
| 7,579,613 B2 | 8/2009 | Lung et al. | |
| 7,606,059 B2 | 10/2009 | Toda | |
| 7,623,370 B2 | 11/2009 | Toda et al. | |
| 7,642,125 B2 | 1/2010 | Lung et al. | |
| 7,778,063 B2 | 8/2010 | Brubaker et al. | |
| 7,825,398 B2 * | 11/2010 | Happ et al. | .......... 257/4 |
| 7,868,313 B2 | 1/2011 | Breitwisch et al. | |

(Continued)

OTHER PUBLICATIONS

Kim et al., "High Performance PRAM Cell Scalable to sub-20nm technology with below 4F2 Cell Size, Extendable to DRAM Applications," 2010 Syposium on VLSI Technology, Digest of Technical Papers, pp. 203-204.

(Continued)

*Primary Examiner* — Eva Yan Montalvo

(74) *Attorney, Agent, or Firm* — Haynes Beffel & Wolfeld LLP

(57) ABSTRACT

A memory device includes an array of electrodes that includes thin film plates of electrode material. Multilayer strips are arranged as bit lines over respective columns in the array of electrodes, including a layer of memory material and a layer of top electrode material. The multilayer strips have a primary body and a protrusion having a width less than that of the primary body and is self-aligned with contact surfaces on the thin film plates. Memory material in the protrusion contacts surfaces on the distal ends of thin film plates of electrodes in the corresponding column in the array. The device can be made using a damascene process in self-aligned forms over the contact surfaces.

14 Claims, 10 Drawing Sheets

U.S. PATENT DOCUMENTS

| | | | |
|---|---|---|---|
| 2002/0042158 A1 | 4/2002 | Kersch et al. |
| 2003/0003647 A1 | 1/2003 | Dennison et al. |
| 2003/0215978 A1 | 11/2003 | Maimon et al. |
| 2004/0026686 A1 | 2/2004 | Lung |
| 2004/0114317 A1 | 6/2004 | Chiang et al. |
| 2005/0019975 A1 | 1/2005 | Lee et al. |
| 2005/0029502 A1 | 2/2005 | Hudgens |
| 2005/0127347 A1 | 6/2005 | Choi et al. |
| 2006/0001174 A1 | 1/2006 | Matsui |
| 2006/0003263 A1 | 1/2006 | Chang |
| 2006/0077741 A1 | 4/2006 | Wang et al. |
| 2006/0108667 A1 | 5/2006 | Lung |
| 2006/0110878 A1 | 5/2006 | Lung et al. |
| 2006/0172067 A1 | 8/2006 | Ovshinsky et al. |
| 2006/0175596 A1 | 8/2006 | Happ et al. |
| 2007/0045605 A1 | 3/2007 | Hsueh |
| 2007/0045606 A1 | 3/2007 | Magistretti et al. |
| 2007/0108430 A1 * | 5/2007 | Lung | 257/4 |
| 2007/0176251 A1 | 8/2007 | Oh et al. |
| 2007/0235710 A1 | 10/2007 | Matsuzaki et al. |
| 2007/0246782 A1 | 10/2007 | Philipp et al. |
| 2008/0019170 A1 | 1/2008 | Happ et al. |
| 2008/0116441 A1 | 5/2008 | Raghuram et al. |
| 2009/0014706 A1 | 1/2009 | Lung |
| 2009/0017577 A1 | 1/2009 | An et al. |
| 2009/0148980 A1 | 6/2009 | Yu |
| 2009/0261313 A1 * | 10/2009 | Lung et al. | 257/4 |
| 2009/0298223 A1 | 12/2009 | Cheek et al. |
| 2010/0193763 A1 | 8/2010 | Chen et al. |
| 2010/0291747 A1 | 11/2010 | Lung et al. |
| 2011/0034003 A1 | 2/2011 | Lung |

OTHER PUBLICATIONS

Yamada, N., "Potential of Ge-Sb-Te Phase-Change Optical Disks for High-Data-Rate Recording," SPIE v.3109, pp. 28-37 (1997).

Gilbert N.E. et al., "A macro model of programmable metallization cell devices," Solid-State Electronics 49 (2005) 1813-1819.

* cited by examiner

SIDEWALL THIN FILM ELECTRODE WITH SELF-ALIGNED TOP ELECTRODE AND PROGRAMMABLE RESISTANCE MEMORY

PARTIES TO A JOINT RESEARCH AGREEMENT

International Business Machines Corporation, a New York Corporation, and Macronix International Corporation, Ltd., a Taiwan corporation, are parties to a Joint Research Agreement.

BACKGROUND OF THE INVENTION

1. Field of the Invention

The present invention relates to high density memory devices based on phase change memory materials, like chalcogenides, and on other programmable resistance materials, and methods for manufacturing such devices.

2. Description of Related Art

Phase change materials are capable of being switched between a first structural state in which the material is in a generally amorphous solid phase, and a second structural state in which the material is in a generally crystalline solid phase in the active region of the cell. The term amorphous is used to refer to a relatively less ordered structure, more disordered than a single crystal, which has detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material may be switched into either different solid phases or mixtures of two or more solid phases, providing a gray scale between completely amorphous and completely crystalline states.

The change from the amorphous to the crystalline state is generally a lower current operation, requiring a current that is sufficient to raise the phase change material to a level between a phase transition temperature and a melting temperature. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from a crystalline state to an amorphous state. The magnitude of the needed reset current can be reduced by reducing the volume of the active region in the phase change material element in the cell. Techniques used to reduce the volume of the active region include reducing the contact area between electrodes and the phase change material, so that higher current densities are achieved in the active volume, with small absolute current values through the phase change material element.

A memory cell structure under development, referred to sometimes as a "mushroom" cell because of the shape of the active region on the bottom electrode in a typical structure, is based on the formation of a small electrode in contact with a larger portion of phase change material, and then a usually larger electrode in contact with an opposite surface of the phase change material. Current flow from the small contact to the larger contact is used for reading, setting and resetting the memory cell. The small electrode concentrates the current density at the contact point, so that an active region in the phase change material is confined to a small volume near the contact point. See, for example, An et al., "Methods of Forming Phase Change Memory Devices having Bottom Electrodes," United States Patent Application Publication No. US 2009/0017577; and Lung, "Method for Manufacturing a Small Pin on Integrated Circuits or Other Devices," United States Patent Application Publication No. US 2006/0108667. Other structures of this type are described in U.S. Pat. No. 7,642,125 by Lung et al., and in references cited therein.

It has been proposed to make electrodes using sidewall spacers with trimmed widths, at least near the contact surface with the phase change material as shown in U.S. Pat. No. 6,617,192, by Lowrey et al. (See, FIG. 1D and column 9, lines 50-57). As shown in Lowrey et al., these sidewall spacer electrode have the thickness of the thin film sidewall material, resulting in a contact surface that is quite small, and which can be relatively uniform in size across an array. See also, Kim, et al., "High Performance PRAM Cell Scalable to sub-20 nm technology with below $4F^2$ Cell Size, Extendable to DRAM Applications," 2010 Symposium on VLSI Technology, Digest of Technical Papers, pages 203-204.

Also, it is desirable to provide a structure that can be laid out with a small number of lithographic steps or other patterning steps that require tolerance in the area of layout for alignment errors.

It is desirable therefore to provide a reliable electrode structure, and method for manufacturing a memory cell structure with control over the critical dimensions of the contact area between the electrode the memory material, which will work with high density integrated circuit memory devices.

SUMMARY

A memory device is described including an array of electrodes some or all of which comprise thin film plates of electrode material having proximal ends in electrical communication with corresponding access devices, and distal ends having contact surfaces having areas determined by thicknesses of the thin film plates at the contact surfaces, and widths of the thin film plates at the contact surfaces, and including self-aligned top electrodes. The device includes a plurality of multilayer strips which are arranged over respective columns in the array of electrodes. The multilayer strips include a layer of memory material and a layer of top electrode material which can be arranged as a bit line. The multilayer strips have respective primary bodies and protrusions, where the protrusions have widths less than that of the primary body. Memory material in the protrusions contacts the contact surfaces on the distal ends of the thin film plates at the contact surfaces along a column in the array of electrodes.

The multilayer strips, and the protrusions on the multilayer strips in embodiments of the memory device described herein, are self-aligned with the contact surfaces on the corresponding thin film plates. As described below, multilayer strips can be formed in self-aligned forms in an insulating fill material over the thin film plates of the bottom electrodes. As a result of the self-aligned process, the protrusions are centered on and symmetrical about the center of the contact surfaces of the thin film plates. Also, as a result of the self-alignment, the primary bodies of the multilayer strips are centered on and symmetrical about the center of the contact surfaces of the thin film plates. The top electrode material in the multilayer strips provides therefore, self-aligned top electrodes for the memory cells.

A method for manufacturing a memory device as described above, is set forth herein. In general, the thin film plate bottom electrodes can be formed using a sidewall process, optionally with a trimmed top surface to form contact areas having widths less than minimum lithographic feature sizes for the processes used to manufacture the device. Self-aligned forms can be used for creating multilayer strips described above. Such forms can be made by forming strips of a sacrificial material in a layer of insulating fill, where the strips are self-aligned with the contact surfaces, and then growing a spacer material in a process that is seeded by the strips of sacrificial material, resulting in formation of an embodiment that extends upwardly from the insulating fill and outwardly from the strips of sacrificial material. Alternatively, the spacer material can be formed by a sidewall spacer process. Insulating fill is applied over the space material, and then planarized to expose the upper surfaces of the spacer material. Spacer material can be removed leaving the self-aligned forms in the insulating material, used for forming the self-aligned multilayer strips by a damascene process. The self-aligned trenches can be created using the same etch mask utilized to form the thin film plate bottom electrodes, and thereby allow formation of the multilayer strips which can be arranged as bit lines without the use of an additional mask. In other embodiments, the self-aligned forms can be made using the etch mask itself as the sacrificial material, followed by the growth or formation of spacer material and filling as described above.

Other aspects and advantages of the present invention can be seen on review of the drawings, the detailed description, and the claims which follow.

DETAILED DESCRIPTION

A detailed description of embodiments of the technology described herein is provided with reference to FIGS. 1-23.

Figure 1:
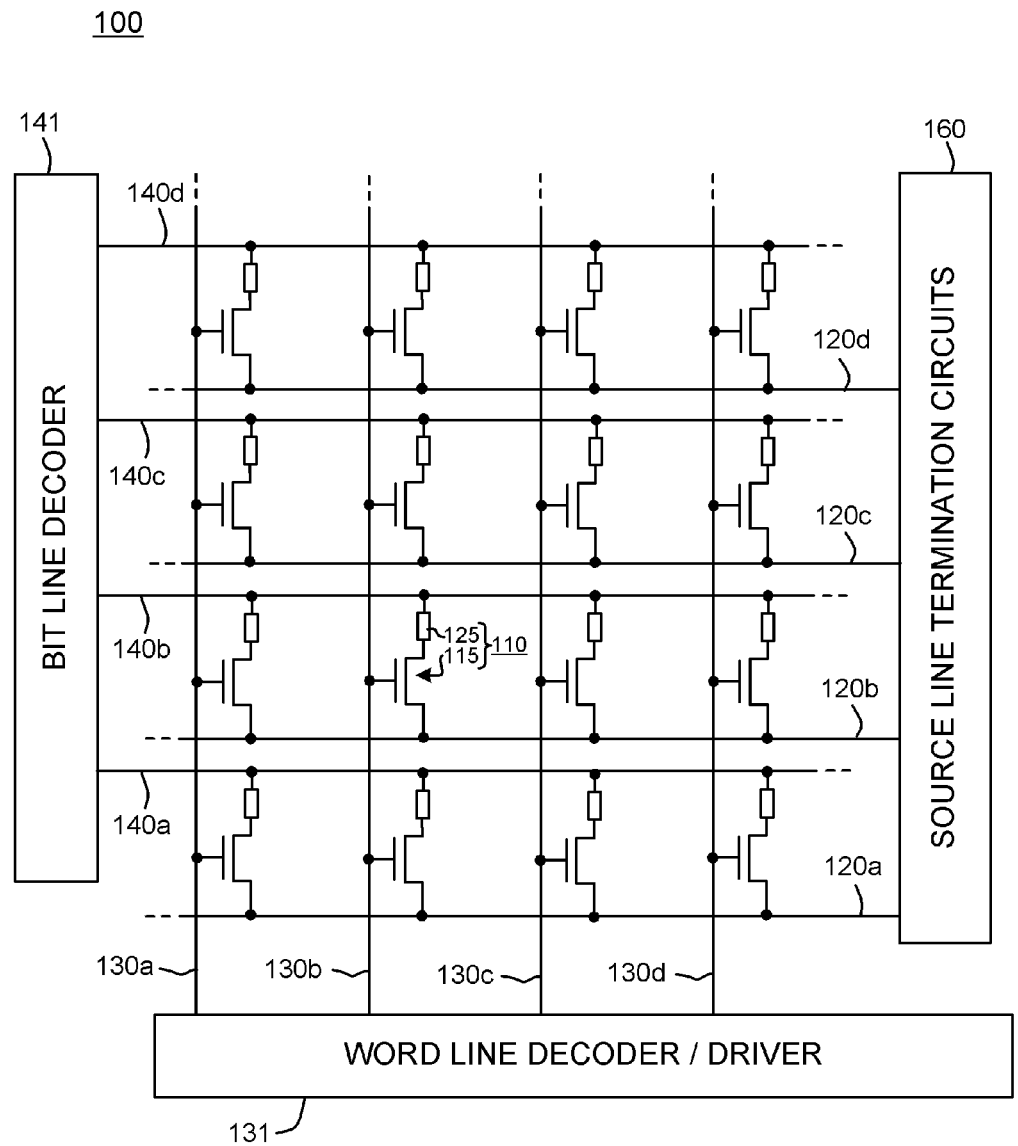
FIG. 1 is a schematic diagram of a portion of a memory cell array implemented using programmable resistance memory cells according to the prior art.

FIG. 1 is a schematic diagram of a portion of a memory cell array 100 implemented using programmable resistance memory cells, as is typical of prior art integrated circuit memory designs. The array 100 comprises a plurality of bit lines 140a-140d extending in parallel in a first direction and in electrical communication with bit line decoder 141. A plurality of word lines 130a, 130b, 130c, 130d extend in parallel in a second direction and are in electrical communication with word line decoder/driver 131. In the schematic diagram of FIG. 1, each of the memory cells (e.g. a cell including memory element 125) of array 100 is coupled to an access device (e.g. transistor 115) arranged in electrical series between a bit line in the set of bit lines 140a-140d, that is in turn coupled to a bit line decoder 141, and a source line 120a-120d, that is in turn coupled to a source line termination circuit, which in some embodiments may also include a decoder. Other devices can be arranged to act as access devices including, for example, bipolar junction transistors and diodes, in memory arrays of this sort.

Memory cell 110 is representative of memory cells of array 100 and includes a bottom electrode on a contact coupled to an access device such as a field effect transistor 115, includes a memory element 125 of programmable resistance memory material, comprising a phase change material, for example, and includes a top electrode. In the example described herein, the programmable resistance memory material and the top electrode are components of the multilayer strips that are self-aligned with the underlying thin film plate bottom electrodes. The memory cell 110 and transistor 115 are arranged electrically in series between the bit line (e.g. 140a) and the corresponding source line termination circuits 160 via the source lines 120a-120d. The word line 130b acts as the gate terminal of the transistor 115, and the first terminal (acting as the source or drain of the transistor 115) is coupled to common source line 120b.

The programmable resistance material can be a phase change material, in which case the memory cell can be referred to as a phase change memory cell. Reading or writing to a phase change memory cell 110 of array 100 can be achieved by applying an appropriate voltage to the corresponding word line 130b and an appropriate voltage or current to the corresponding bit line (e.g. 140a) to induce a current through the memory element 125. The level and duration of the voltages/currents applied is dependent upon the operation performed, e.g. a reading operation or a writing operation.

In a reset (erase) operation of the phase change memory cell 110, a reset pulse applied to the word line 130b and the bit line 140b induces a current through the memory element 125 to cause a transition of an active region of the memory element 125 into an amorphous phase, thereby setting the phase change material to a resistance within a resistance value range associated with the reset state. The reset pulse is a relatively high energy pulse, sufficient to raise the temperature of at least the active region of the memory element 125 above the transition (crystallization) temperature of the phase change material and also above the melting temperature to place at least the active region in a liquid state. The reset pulse is then quickly terminated, resulting in a relatively quick quenching time as the active region quickly cools to below the transition temperature so that the active region stabilizes to a generally amorphous phase.

In a set (or program) operation of phase change memory cell 110, a program pulse is applied to the word line 130b and the bit line 140b of suitable amplitude and duration to induce a current through the memory element 125 sufficient to raise the temperature of at least a portion of the active region of the memory element 125 above the transition temperature and cause a transition of at least a portion of the active region from the amorphous phase into a crystalline phase, this transition lowering the resistance of the memory element 125 and setting the memory cell 110 to the desired state.

In a read (or sense) operation of the data value stored in the memory cell 110, a read pulse is applied to the corresponding word line 130b and the corresponding bit line 140b of suitable amplitude and duration to induce current to flow through the memory element 125 that does not result in the memory element 125 undergoing a change in resistive state. The current through the memory cell 110 is dependent upon the resistance of the memory element 125 and thus the data value stored in the memory cell 110. The data valued stored in the memory cell 110 may be determined, for example, by comparison of the current on bit line 140b with a suitable reference current by sense amplifiers (not shown). Alternatively, the data value stored in the memory cell 110 may be determined, for example, using source side sensing.

A memory cell and array structure can be made as described herein using a fully self-aligned process, reducing the layout area required for the array, and without exposing active areas of the memory material to etch chemistry which might damage the performance of the device.

FIGS. 2-5 are simplified perspective views which illustrate stages in the process of manufacturing sidewall, thin film plate bottom electrodes as described herein, with self-aligned top electrodes.

Figure 2:
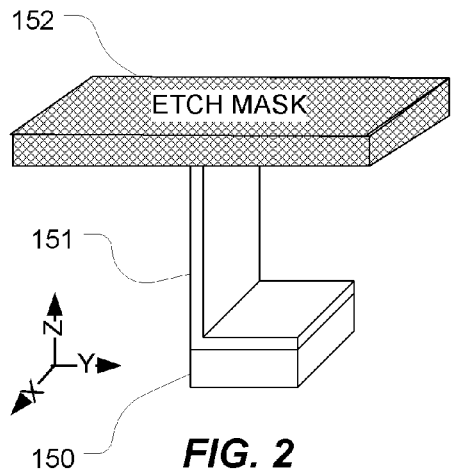
FIGS. 2-7 illustrate stages of a manufacturing process to form memory cells, and perspectives of the memory cells, as described herein, with top and bottom electrodes and memory elements.

In FIG. 2, the illustration includes a thin film plate 151 of electrode material formed using, for example, a sidewall structure, and an etch mask 152 orthogonal to the width of the thin film plate 151. In the illustration, the thin film plate 151 includes a vertical portion and a horizontal portion, where the horizontal portion is positioned at the proximal end of the vertical portion, overlies the underlying bottom contact 150, and makes the electrical contact thereto. An insulating fill or other fill material not shown in the diagram surrounds the thin film plate 151, and provides a planar surface at the distal end of the thin film plate 151, on which the etch mask 152 is formed. The etch mask 152 extends along the Y-axis shown in the diagram, across the thickness of the thin film plate 151, and orthogonal to the width (along the X-axis) of the thin film plate 151.

Figure 3:
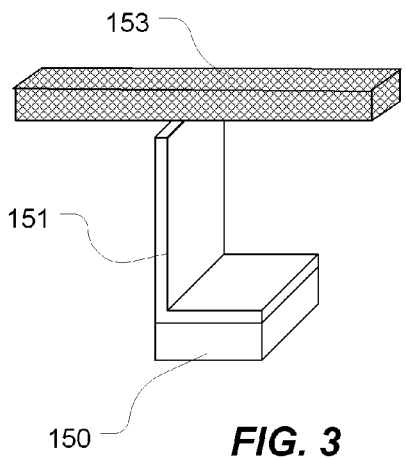

In FIG. 3, the illustrated structure shows the results of a subsequent process, such as isotropic etching, which has been applied to trim the etch mask 152 to form a more narrow etch mask 153. The more narrow etch mask 153 can have a width along the X-axis that is less than the minimum feature size of the lithographic processes, or other patterning process, used to define the etch mask 152.

Figure 4:
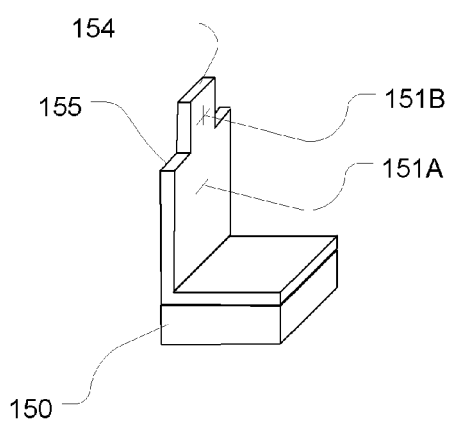

In FIG. 4, the illustrated structure shows the results of an etching process, such as anisotropic etching which relies on the more narrow etch mask 153 to etch from the distal end of the thin film plate toward the proximal end of the thin film plate, at least partially. In some embodiments, the etching process can continue the entire length of the thin film plate to the proximal end. The thin film plate 151, as a result of etching using a more narrow etch mask 153, has a shape including a first segment 151A having a first width at the proximal end and extending toward the distal end to an intermediate transition location 155 between the proximal and distal ends, and a second segment 151B extending from the first segment to the distal end in which the width narrows to a second width at a top surface 154. In the illustrated embodiment, the transition between the first segment 151A and the second segment 151B is abrupt to simplify the illustration. However, a more gradual or tapered change in width of the film plate can be implemented.

Figure 5:
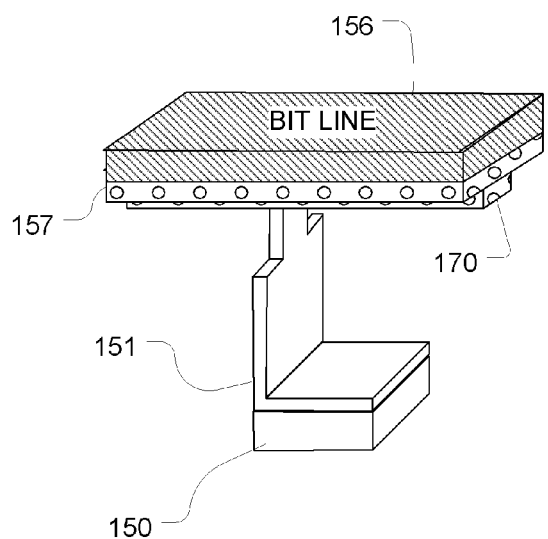

In FIG. 5, the illustrated structure shows the results of processes used to form memory elements self-aligned and in contact with the thin film plate 151, including a multilayer strip including a layer 157 of memory material, with overlying layer 156 of top electrode material, arranged as a bit line. The multilayer strip (156, 157) has a primary body of a first width, and protrusions 170 along the primary body and more narrow than the primary body. The protrusions 170 are self-aligned with a contact surface on the thin film plate 151 as described in more detail below. Thus, the bit line extends along the Y-axis, orthogonal with the major surfaces of thin film plate 151, which lie in the X-Z plane shown in the illustration, as a result of this orientation.

Figure 6:
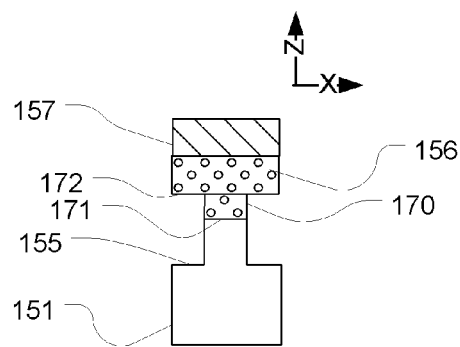

FIG. 6 is a cross-section view in the X-Z plane of the structure, and illustrates the protrusion in the multilayer strip (156, 157). In this example, the protrusion is filled by the layer 156 of memory material. In other examples, the protrusion may also include some of the top electrode material. FIG. 6 is a cross-section view across the X-Z plane of a bottom electrode formed by a thin film plate 151, having vertical and horizontal portions as shown in FIGS. 2-5. The transition location 155 between the upper and lower portions of the thin film plate 151 is illustrated for reference. As illustrated, the multilayer strip includes a protrusion 170 in the illustrated structure. The protrusion 170 has a proximal region in the upper portion preferably integral with, such as by having been formed in a single deposition process, or in contact with, a lower portion 172 of the primary body of the multilayer strip. The protrusion 170 has a distal surface in the lower portion, in which memory material in the layer 156 is in contact with a contact surface 171 on the thin film plate 151.

As illustrated, the proximal end of the protrusion has a width which is less than that of the primary body of the multilayer strip.

Although not illustrated in FIG. 6, the protrusions extend through corresponding forms in a layer of insulating fill material, the corresponding forms being aligned with the contact surfaces of the corresponding thin film plates on a column in the array.

Figure 7:
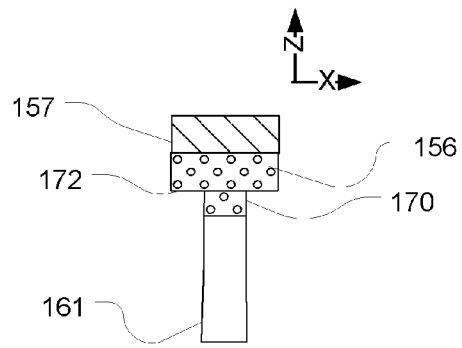

FIG. 7 is a cross-sectional view in the X-Z plane of the structure, in an alternative, where the thin film plate 151 of FIG. 6 is replaced by a thin film plate 161, which has a width from its proximal to distal ends which is substantially uniform, as a result of an etch process which cuts through the full depth of the sidewall structures to form the thin film plate 161. The structure can be understood in more detail on review of the processes described below.

Figure 8:
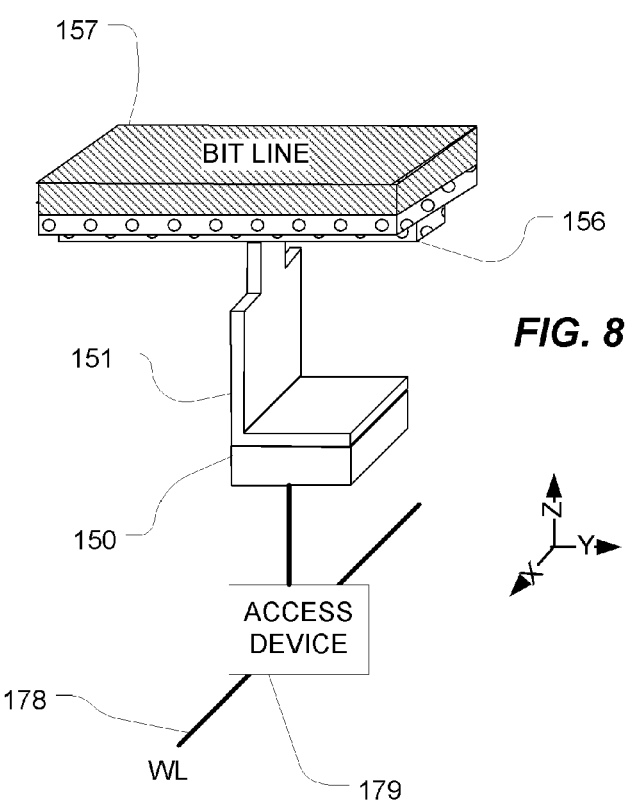
FIG. 8 is a simplified drawing of a memory cell and access device.

FIG. 8 illustrates the structure shown in FIG. 5, with the addition of an access device 179 and a word line 178 illustrating an embodiment of the memory array including the thin film plate bottom electrodes as described herein, with self-aligned multilayer strips acting as bit lines arranged along the Y-axis and the word line 178 controlling access device 179 extending along the X-axis. Access devices 179, such as field effect transistors, bipolar transistors, diodes and the like, can be activated using the word line 178.

Embodiments of the programmable resistance material of the memory elements include phase-change-based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with a year other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase-change-based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bS_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistance memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example, at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same," which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. Also, a combination of DC bias and a collimator can be used.

An exemplary method for forming chalcogenide material uses chemical vapor deposition CVD such as that disclosed in US Publication No 2006/0172067 entitled "Chemical Vapor Deposition of Chalcogenide Materials," which is incorporated by reference herein.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

Electrode materials used for the thin film plate bottom electrodes, and for the top electrodes, can comprise a variety of materials and combinations of materials in multi-layer structures. Materials can be chosen for compatibility with the programmable resistance memory material utilized, and with the metallization processes utilized, in the fabrication facility. Representative materials used with phase change materials such as chalcogenides may comprise, for example, TiN or TaN. Alternatively, the electrodes may be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof.

FIGS. 9-22 illustrate stages in a manufacturing process for a memory device as described herein. Generally, the process includes forming an array of electrodes including rows and columns, electrodes in the array comprising thin film plates of electrode material. The thin film plates have respective proximal ends in electrical communication with corresponding access devices, and distal ends having contact surfaces with respective contact areas. The areas of the contact surfaces are determined by the thicknesses of the thin film plates at the contact surfaces and the widths of the thin film plates at the contact surfaces. Next, an array of self-aligned forms is formed over the array of electrodes. Forms in the array have openings exposing the contact surfaces of the thin film plates of corresponding bottom electrodes. Next, elements of memory material are formed filling in the forms in the array of self-aligned forms. The elements of memory material have primary bodies and protrusions extending into the forms and contacting the contact surfaces on the distal ends of the corresponding thin film plate of electrodes. Finally, top electrodes are formed in contact with the elements of memory material, such as in the form of a bit line which includes segments acting as the top electrodes. An embodiment of this process can be understood with respect to FIGS. 9-22.

Figure 9:
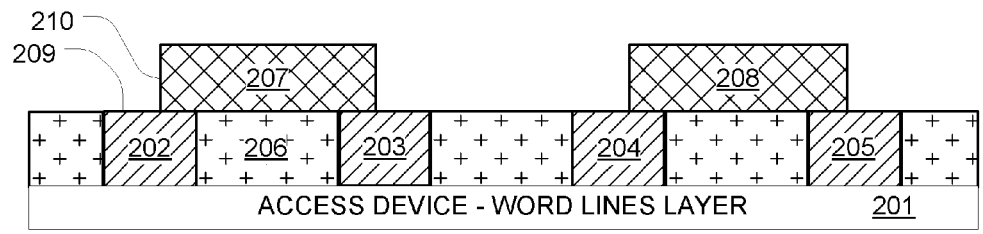
FIGS. 9-22 illustrate stages of a representative manufacturing process for memory devices as described herein.

FIG. 9 is a cross-section Y-Z plane, showing a column of contacts 202-205 on an access device-word lines layer 201 in an integrated circuit substrate. The access device-word lines layer 201 can be made as mentioned above using a variety of technologies, including horizontal and vertical transistors, field effect transistors, bipolar junction transistors, diodes, and other switching elements. A column of contacts 202-205 is part of an array of contacts in insulating fill layer 206. The top surfaces (e.g. 209) of the contacts 202-205 are exposed at the surface of the insulating fill 206, such as by performing a planarizing process or the like after depositing the fill over contact structures, or by forming vias through the fill 206 and filling the vias with contact plugs. A plurality of strips 207, 208 of insulating material is defined over the array of contacts. The strips have side surfaces (e.g. 210) aligned over contacts (e.g. 202) in corresponding columns in the array, so that at least portions of the surfaces (e.g. 209) of the corresponding contacts are exposed between the strips 207, 208.

Figure 10:
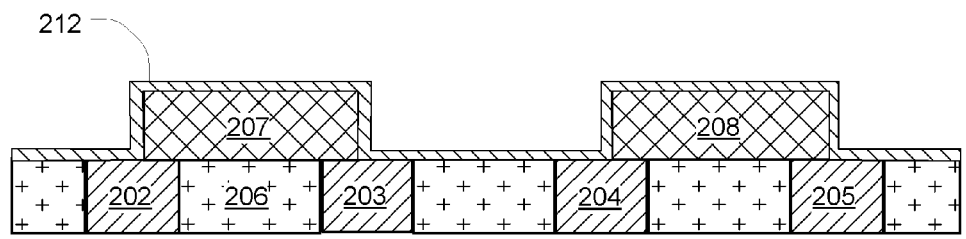
Figure 11:
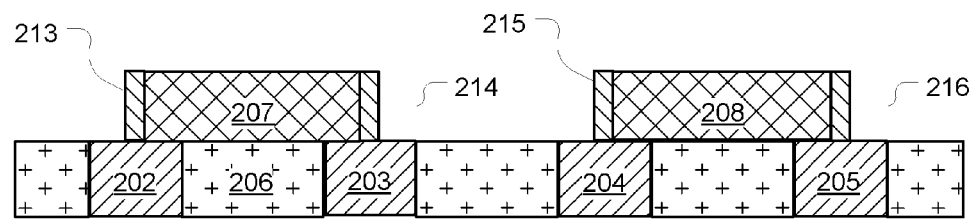
Figure 12:
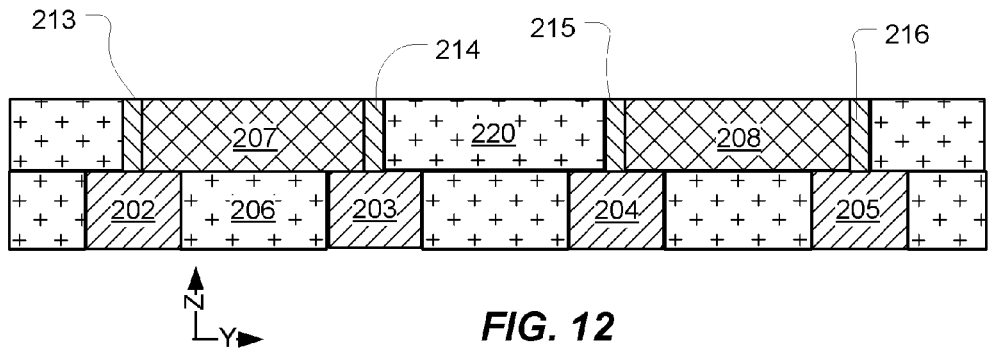

FIG. 10 illustrates structure after depositing a thin film layer of electrode material 212 over the structure of FIG. 9. FIG. 11 shows the results of anisotropicly etching the thin film layer of electrode material 212, which results in formation of sidewall spacers which will be divided to form thin film plates 213, 214, 215, 216 of electrode material in contact with contacts 202, 203, 204, 205. FIG. 12 illustrates the structure after applying insulating fill 220 and a planarizing process which exposes top surfaces of the thin film plates 213, 214, 215, 216.

Figure 13:
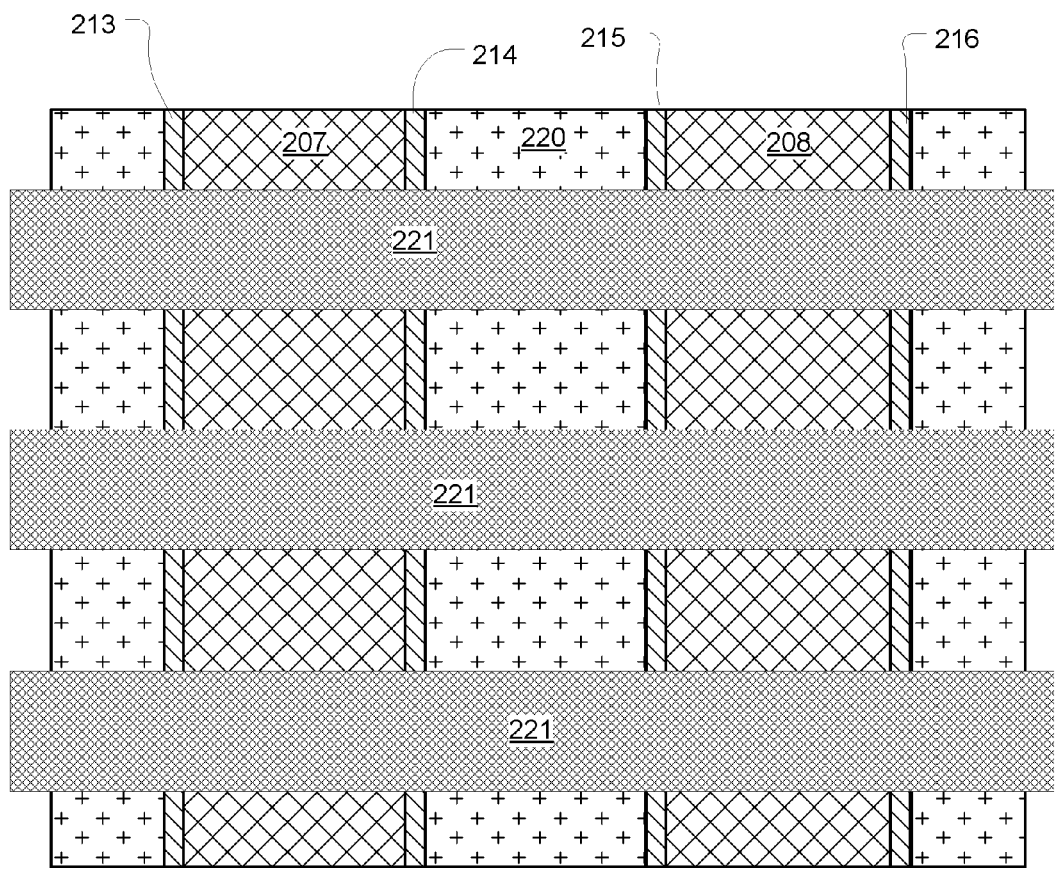
Figure 14:
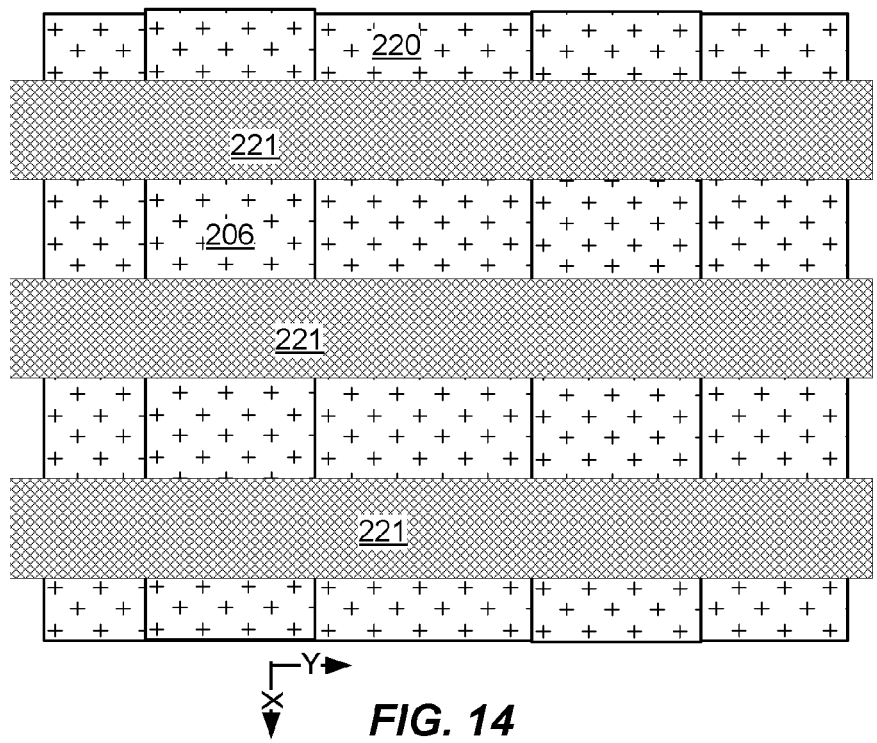

FIG. 13 is a plan view in the X-Y plane showing the results of a process to form an etch mask 221 which includes a plurality of strips of etch mask material extending along the x-axis, orthogonal to the columns of contacts, such as a silicon nitride or silicon material. FIG. 14 illustrates the structure, also in plan view in the X-Y plane, after performing an etch process which separates the sidewall spacers and exposes the underlying fill material 220, 206. The separated sidewall spacers form the individual thin film plates 213, 214, 215, 216 of electrode material (hidden beneath the etch mask 221 and FIG. 14), suitable for acting as bottom electrodes.

Figure 15:
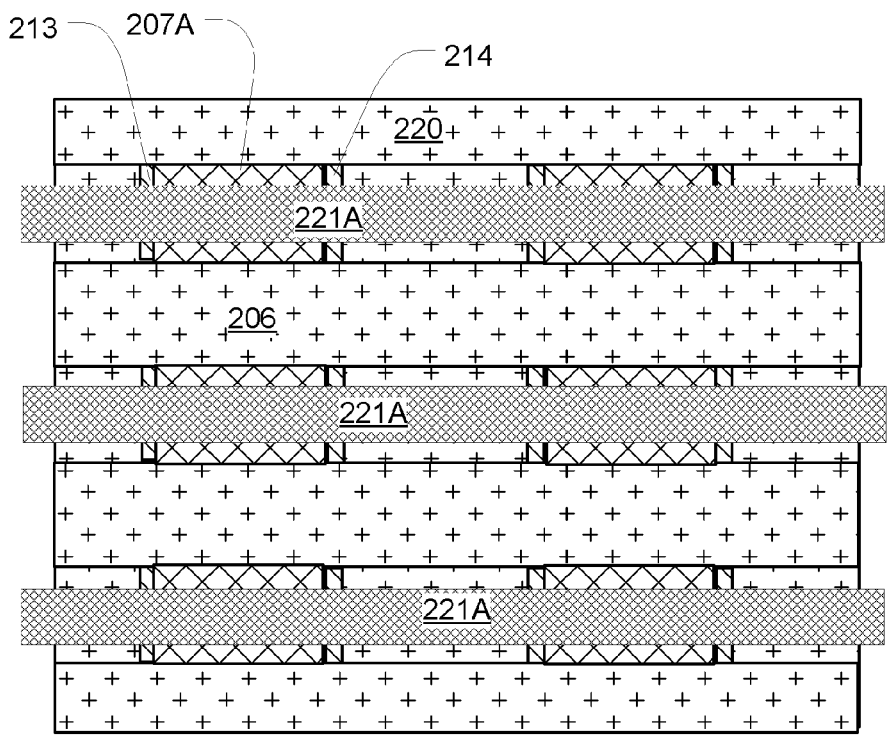

FIG. 15 is a plan view in the X-Y plane showing the results of a process used to trim the etch mask 221 to form a more narrow etch mask 221A. This process can be applied to create contact surfaces that have widths less than the minimum feature size of a lithographic process, or other patterning process used to define the etch mask 221. When the more narrow etch mask 221A is formed, portions of the top surfaces of the thin film plates 213, 214 are exposed, as well as remaining parts 207A of the insulating strips 207 used to form the sidewall structures. A process can be applied to remove or etch back the top surfaces of the thin film plates 213, 214 to form the segmented or tapered thin film plate structure discussed above with reference to FIGS. 2-4 for example.

Figure 16:
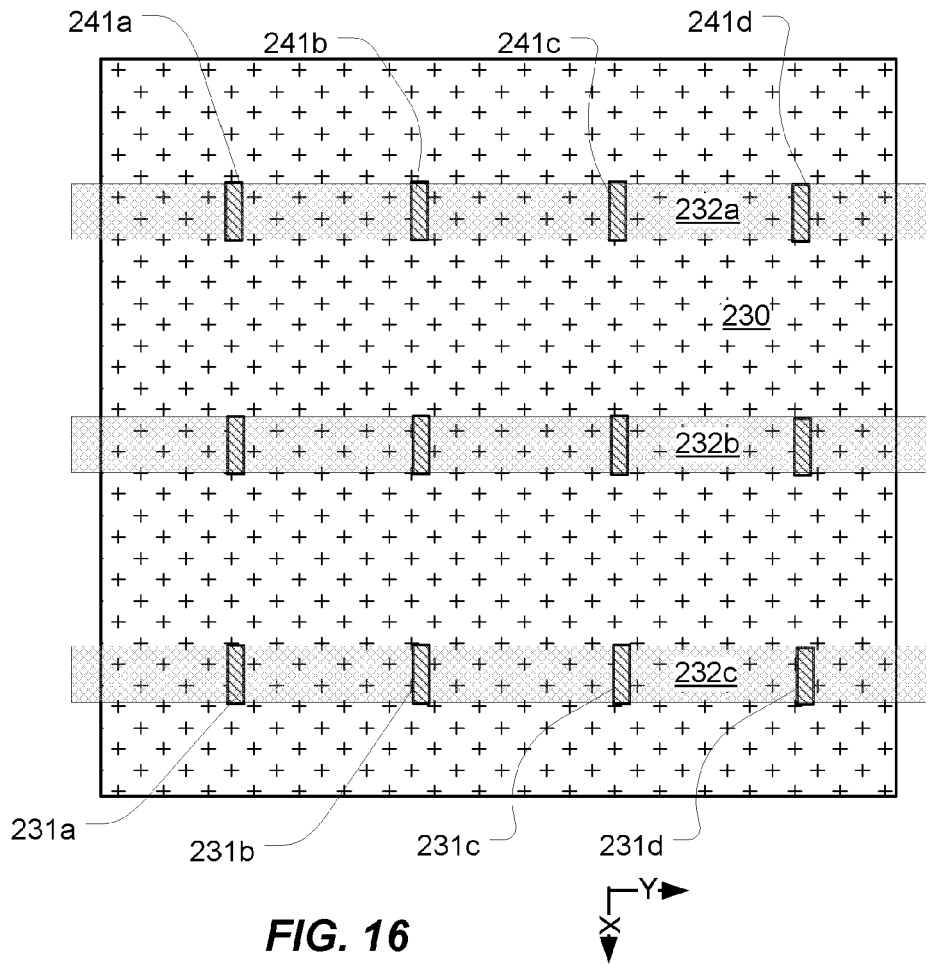

FIG. 16 is a plan view in the X-Y plane showing results of a process for formation of self-aligned strips 232a-232c of sacrificial material, overlying contact surfaces (not shown in the drawing but actually beneath the strips 232a-232c) of corresponding columns of bottom electrodes. One alternative process for accomplishing this includes filling and planarizing the structure of FIG. 15 and then etching back the exposed etch mask material to form recesses (not shown in the plan view) in the fill 230 over the contact surfaces on the thin film plates. Then a sacrificial material, such as silicon or other material suitable for seeded growth of spacer material or as acting as a base feature for formation of sidewall spacers, is deposited in the resulting trenches. Alternatively, the mask material used for mask 221A can be a seed material, or can be a spacer material as described below, in which case the removal and re-filling steps can be omitted. After this, an array of contact surfaces 231a-231d along one column, 241a-241d along another column, and so on, is exposed within corresponding recesses on a top surface of insulating fill 230.

Figure 17:
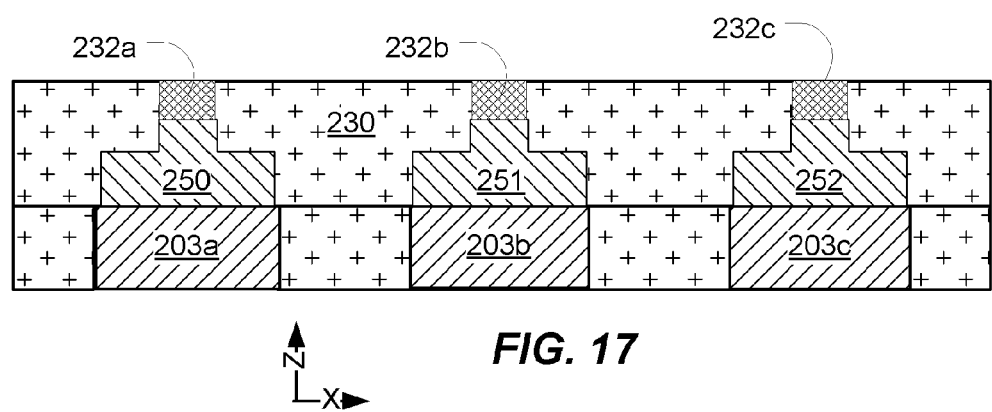

FIG. 17 is a cross-section in the X-Z plane of the structure of FIG. 16, strips 232a-232c of sacrificial material within recesses and exposed on a top surface of the insulating fill 230. The strips 232a-232c of sacrificial material can comprise material such as silicon or other material which can act as a seed for selective growth, or as a body used for sidewall spacer formation, as applied in following steps.

Figure 18:
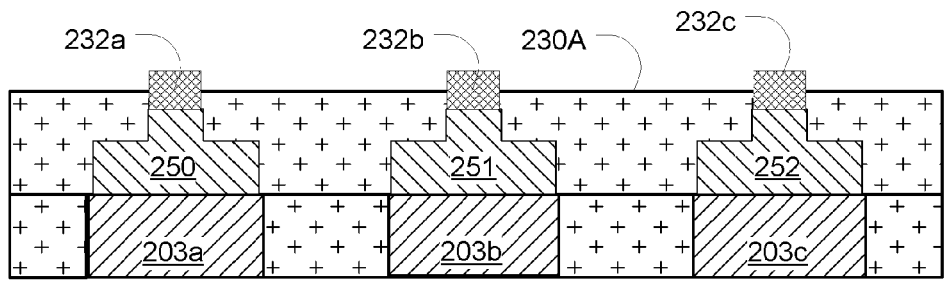

FIG. 18 is a cross-section in the X-Z plane of the structure resulting from an etch back process that lowers the surface 230A of the fill 230 to create protrusions of the strips 232a-232c which can facilitate selective growth of material, or provide sidewalls for formation of spacers.

Figure 19A:
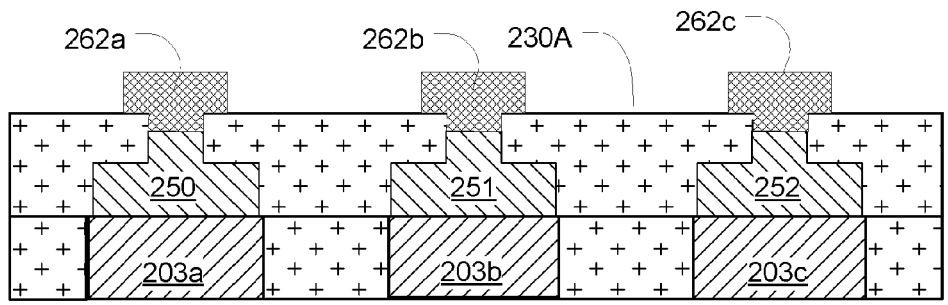

FIG. 19A is a cross-section in the X-Z plane of the structure resulting in selective growth of a spacer material, such as silicon, on the seed elements to create expanded, sacrificial spacers 262a-262c which extend over the surface 230A of the fill 230. The sacrificial spacers 262a-262c have widths which are greater than that of the strips of sacrificial material used to seed the growth.

Figure 19B:
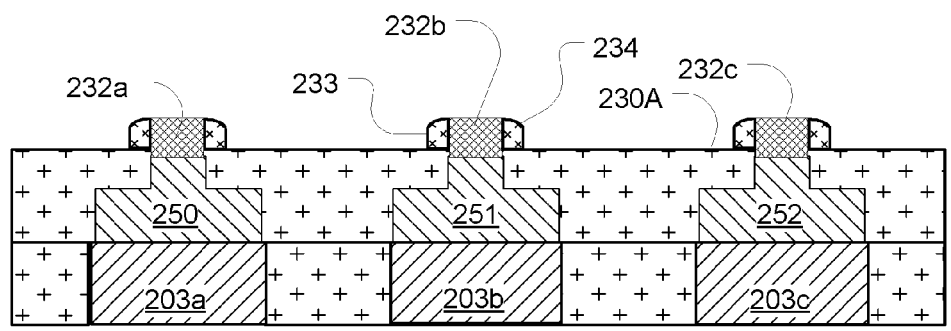

FIG. 19B is a cross-section in the X-Z plane of the structure resulting in a sidewall spacer process on the sacrificial elements to create expanded spacers that include the strips 232a-232c and sidewall spacers (e.g. 233, 234) which extend over the surface 230A of the fill 230. The expanded spacers (e.g. 232b, 233, 234) have widths which are greater than that of the strips of sacrificial material that are used as a foundation for the sidewall formation. The sidewall spacers 233, 234 can be made using a uniform thickness deposition over the structure followed by anisotropic etching, to leave the sidewalls as known in the art. Materials suitable for use a spacers 233, 234 include for example, silicon, silicon oxide, silicon nitride, or other materials that may be selectively removed as described below. This sidewall process results in formation of sacrificial spacers that comprise the strips 232a-232c and their sidewalls (e.g. 233, 234).

Figure 20:
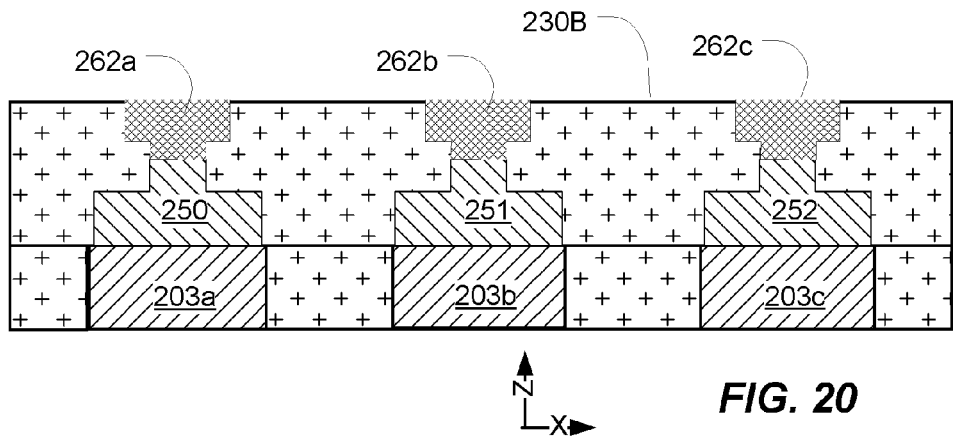
Figure 21:
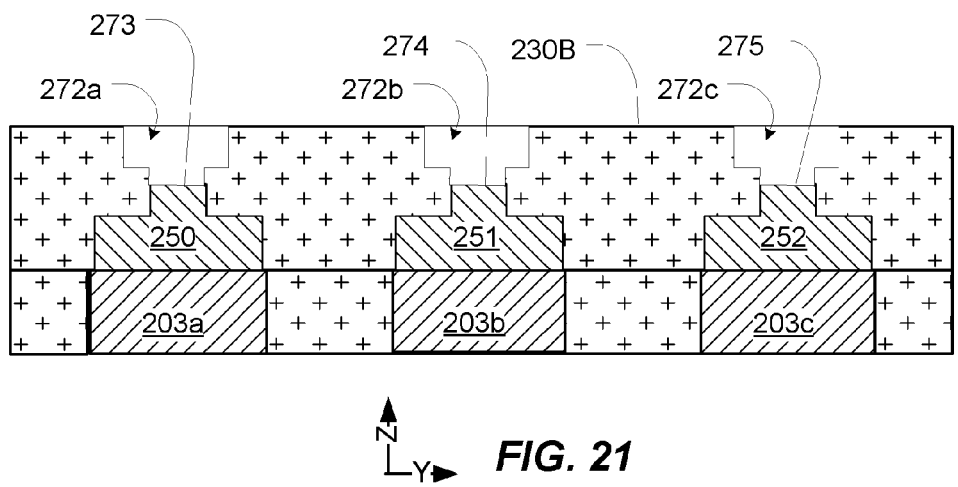

Next, as shown in FIG. 20, the structure if FIG. 19A is filled again raising the surface 230B of the insulating fill 230 to a level close to, or coplanar with, the top of the spacers 262a-262c. Then, the spacers 262a-262c are removed to create self-aligned forms as shown in FIG. 21. The structure shown in FIG. 21 includes self-aligned forms 272a-272c created by removal of the spacers 262a-262c. In the bottom of the form, contact surfaces 273-275 of corresponding thin film plate electrodes are exposed along a column in the array. The process of FIGS. 20 and 21 can be applied to the structure of FIG. 19B equally well, substituting the sacrificial spacers 262a-262c with sacrificial spacers that comprise the strips 232a-232c and their respective sidewalls (e.g. 233, 234).

Figure 22:
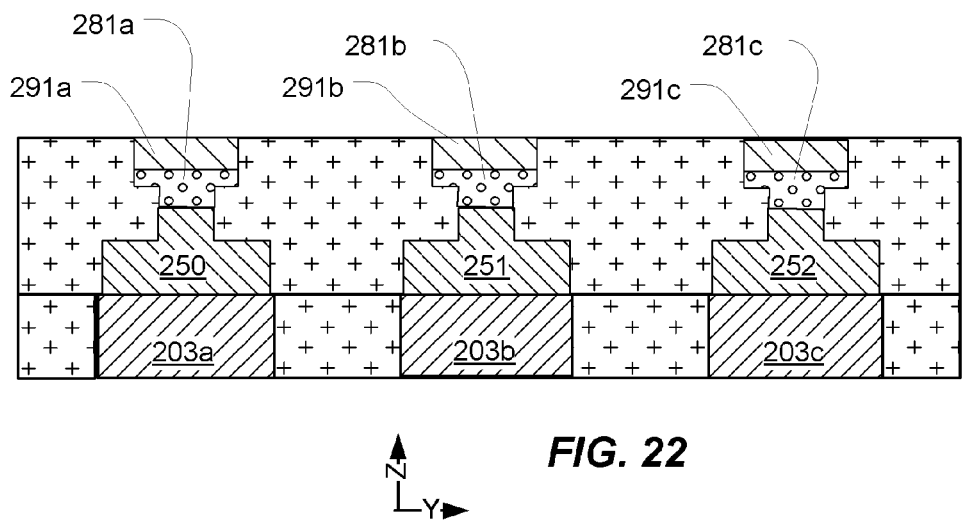

FIG. 22 illustrates the structure in cross-section in the Y-Z plane after depositing a layer of memory material over the surface of the fill 230 and over the self-aligned forms 272a-272c. A result of the deposition of the layer of memory material, protrusions 281a-281c of the layer of memory material extend into the self-aligned forms, and contact the contact surfaces of the corresponding thin film plate electrodes 250-252 along the column. Next a layer of top electrode material is deposited over the memory material. The layer of memory material and the layer of top electrode material are etched back to remove the layers in regions outside the forms, and after the etch back, comprise multilayer strips arranged as bit lines on the array, including top electrode layers 291a-291c. Both the protrusions and the primary bodies of the multilayer strips configured as bit lines in this example are self-aligned with the contact surfaces on the underlying thin film plate bottom electrodes.

Figure 23:
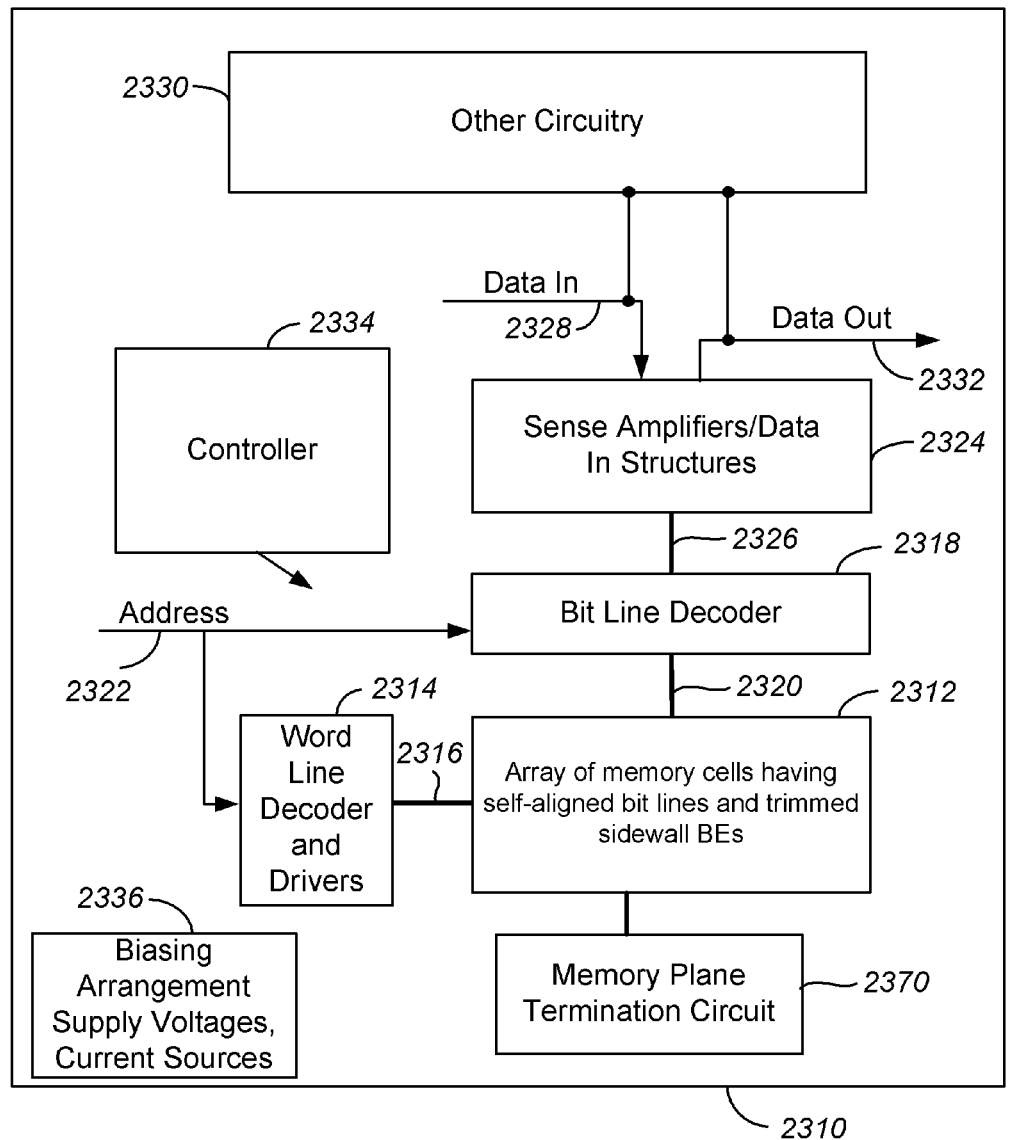
FIG. 23 is a simplified block diagram of an integrated circuit including a memory array implemented using memory cells including memory elements self-aligned with bit line parallel bottom electrodes as described herein.

FIG. 23 is a simplified block diagram of an integrated circuit 2310 including a memory array 2312 implemented using memory cells self-aligned with corresponding bit-line parallel, thin film plate electrodes as described herein. A memory plane termination circuit 2370 is coupled to the array and provides a common voltage to the memory plane of the array 2312. A word line decoder 2314 having read, set and reset modes is coupled to and in electrical communication with a plurality of word lines 2316 arranged along rows in the memory array 2312. A bit line (column) decoder 2318 is in electrical communication with a plurality of bit lines 2320 arranged along columns in the array 2312 for reading, setting, and resetting the phase change memory cells (not shown) in array 2312. Addresses are supplied on bus 2322 to word line decoder and drivers 2314 and bit line decoder 2318. Sense amplifiers and data-in structures in block 2324, including voltage and/or current sources for the read, set, and reset modes are coupled to bit line decoder 2318 via data bus 2326. Data is supplied via a data-in line 2328 from input/output ports on integrated circuit 2310, or from other data sources internal or external to integrated circuit 2310, to data-in structures in block 2324. Other circuitry 2330 may be included on integrated circuit 2310, such as a general purpose processor or special purpose application circuitry, or a combination of modules providing system-on-a-chip functionality supported by array 2312. Data is supplied via a data-out line 2332 from the sense amplifiers in block 2324 to input/output ports on integrated circuit 2310, or to other data destinations internal or external to integrated circuit 2310.

A controller 2334 implemented, in this example, using a bias arrangement state machine, controls the application of bias arrangement supply voltages and current sources 2336, such as read, program, erase, erase verify and program verify voltages and/or currents. Controller 2334 may be implemented using special-purpose logic circuitry as known in the art. In alternative embodiments, controller 2334 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 2334.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing a memory device comprising:
    forming an array of electrodes including rows and columns on a substrate including an array of access devices, at least some of the electrodes in the array comprising thin film plates of electrode material, the thin film plates respectively having lengths with respective proximal ends in electrical communication with corresponding access devices, and distal ends having contact surfaces with respective contact areas, so that the areas of the contact surfaces are determined by a thickness of the thin film plates at the contact surfaces and widths of the thin film plates at the contact surfaces;
    forming a plurality of self-aligned forms over corresponding columns in the array of electrodes, where forms corresponding to columns in the array of electrodes include trenches exposing the contact surfaces of the thin film plates of the electrodes in the corresponding columns;
    forming a layer of memory material in the forms in the plurality of self-aligned forms, extending into the forms and contacting the contact surfaces of the thin film plates of the electrodes in the corresponding columns; and
    forming a layer of top electrode material in the forms in contact with the layer of memory material.

2. The method of claim 1, wherein forms with the layer of memory material and the layer of top electrode material are arranged as bit lines.

3. The method of claim 1, wherein forming the array of self-aligned forms includes
    forming strips of a sacrificial material in a layer of insulating fill, the strips being self-aligned with the contact surfaces of the electrodes in the corresponding columns;
    forming bodies of spacer material on the sacrificial material and extending over the insulation fill;
    applying an insulating fill material leaving exposed surfaces on the bodies of spacer material; and
    removing the bodies of spacer material and the sacrificial material to create self-aligned forms over the thin film plates.

4. The method of claim 3, including using the strips of sacrificial material as an etch mask in formation of the array of electrodes, and thereafter applying an insulating fill to form said strips of sacrificial material in the layer of insulating fill.

5. The method of claim 3, wherein forming the strips of sacrificial material includes forming trenches self-aligned with the contact surfaces of the thin film plates; and
    depositing the sacrificial material within the trenches.

6. The method of claim 5, wherein forming trenches self-aligned with the contact surfaces of the thin film plates includes using an etch mask for defining columns of thin film plate electrodes, and after utilizing the etch mask, filling with an insulating fill and planarizing the insulating fill to expose the etch mask; and then removing the etch mask to form the trenches in the insulating fill.

7. The method of claim 3, wherein said forming bodies of spacer material includes using the strips of sacrificial material as a seed material, and applying a process for selective growth of the spacer material on the seed material.

8. The method of claim 3, wherein said forming bodies of spacer material includes using the strips of sacrificial material as base features for sidewall formation, and forming sidewalls on the strips.

9. A method for manufacturing a memory device, the method comprising:
    forming an array of contacts coupled to corresponding access devices;
    defining a plurality of strips of insulating material, the strips having side surfaces aligned over contacts in corresponding columns in the array;
    forming sidewalls on the side surfaces of the plurality of strips, the sidewalls comprising electrode material and contacting the contacts in the corresponding columns in the array;
    filling between the sidewalls with an insulating material, and planarizing the insulating material to expose top surfaces of the sidewalls;
    applying an etch mask defining lines along columns in the array of contacts, and etching the sidewalls to form separate thin film plates of the electrode material;
    applying an insulating fill material and planarizing the insulating fill material leaving exposed surfaces on the etch mask;
    removing the etch mask from the exposed surfaces to form resulting self-aligned trenches exposing top surfaces of the separate thin film plates, and depositing a sacrificial material within the self-aligned trenches;
    forming bodies of spacer material on the sacrificial material within the self-aligned trenches, the spacer material extending over the insulating fill material and expanding to a width greater than that of the self-aligned trenches;

applying an insulating fill material and planarizing the insulating fill material leaving exposed surfaces of the spacer material;

removing the spacer material and the sacrificial material to create self-aligned forms in the insulating fill material over the thin film plates;

depositing memory material in the self-aligned forms; and depositing top electrode material in the self-aligned form.

10. The method of claim 9, wherein said etching the side walls to form separate thin film plates includes forming an etch mask over the sidewalls, the etch mask including a plurality of strips orthogonal to the columns, and first etching the sidewalls to divide the sidewall into individual plates contacting corresponding contacts in the column, then trimming the etch mask and etching the individual plates at least partway to the corresponding contacts to form a plurality of separate thin film plates.

11. The method of claim 10, wherein a thin film plate in the plurality of separate thin film plates has a proximal end contacting the corresponding contact, and a distal end contacting the layer of memory material, and has a shape including a first segment having a first width at the proximal end, and extending toward the distal end to an intermediate position between the proximal and distal ends, and a second segment extending from the first segment to the distal end in which the width narrows to a second width at the contact surface.

12. A memory device made according to the method of claim 1.

13. A memory device made according to the method of claim 6.

14. An integrated circuit memory device made according to the method of claim 9.

* * * * *